(12) United States Patent
Sytina

(10) Patent No.: US 10,686,290 B2
(45) Date of Patent: Jun. 16, 2020

(54) RADIATION SOURCE

(71) Applicant: ASML Netherlands B.V., Veldhoven (NL)

(72) Inventor: Olga Alexandrovna Sytina, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 273 days.

(21) Appl. No.: 15/550,843

(22) PCT Filed: Jan. 18, 2016

(86) PCT No.: PCT/EP2016/050887
§ 371 (c)(1),
(2) Date: Aug. 14, 2017

(87) PCT Pub. No.: WO2016/131583
PCT Pub. Date: Aug. 25, 2016

(65) Prior Publication Data
US 2018/0034235 A1 Feb. 1, 2018

(30) Foreign Application Priority Data

Feb. 19, 2015 (EP) .................................. 15155798

(51) Int. Cl.
*H01S 3/00* (2006.01)
*H01S 3/23* (2006.01)
(Continued)

(52) U.S. Cl.
CPC ........ *H01S 3/2316* (2013.01); *G03F 7/70025* (2013.01); *G03F 7/70033* (2013.01);
(Continued)

(58) Field of Classification Search
CPC ............. G03F 7/70033; G03F 7/70025; H01S 3/2316; H01S 3/2232; H01S 3/2366;
(Continued)

(56) References Cited

U.S. PATENT DOCUMENTS

| 5,657,153 A | 8/1997 | Endriz et al. |
| 8,462,425 B2 | 6/2013 | Hou et al. |

(Continued)

FOREIGN PATENT DOCUMENTS

| CN | 103748968 A | 4/2014 |
| JP | 2013-546172 A | 12/2013 |

(Continued)

OTHER PUBLICATIONS

International Search Report and Written Opinion of the International Searching Authority directed to related International Patent Application No. PCT/EP2016/050887, dated Apr. 1, 2016; 14 pages.

(Continued)

*Primary Examiner* — Mark Hellner
(74) *Attorney, Agent, or Firm* — Sterne, Kessler, Goldstein & Fox P.L.L.C.

(57) ABSTRACT

A laser system comprises a seed module (33) operable to emit a pulse of a first laser beam followed by a pulse of a second laser beam and a plurality of amplification chambers each comprising a gain medium having a gain, wherein the plurality of amplification chambers are arranged to receive the pulse of the first laser beam (45) and amplify the first laser beam in a second order (PA3, PA2, PA1, PA0) and wherein the plurality of amplification chambers are further arranged to receive the pulse of the second laser beam (41) and amplify the second laser beam in a first order (PA0, PA1, PA2, PA3) which is the reverse of the second order. Saturation powers and small signal gain coefficients of the gain (Continued)

media are selected such that the pulse of the first laser beam experiences a total amplification which is less than the total amplification experienced by the pulse of the second laser beam.

15 Claims, 4 Drawing Sheets

(51) Int. Cl.
  *G03F 7/20*    (2006.01)
  *H05G 2/00*    (2006.01)
  *H01S 3/08*    (2006.01)
  *H01S 3/223*    (2006.01)

(52) U.S. Cl.
  CPC ............ *H05G 2/008* (2013.01); *H01S 3/0071* (2013.01); *H01S 3/0809* (2013.01); *H01S 3/2232* (2013.01); *H01S 3/2366* (2013.01); *H05G 2/003* (2013.01); *H05G 2/005* (2013.01)

(58) Field of Classification Search
  CPC ...... H01S 3/0071; H05G 2/008; H05G 2/003; H05G 2/005
  USPC ........................................................ 359/333
  See application file for complete search history.

(56) References Cited

U.S. PATENT DOCUMENTS

| | | | |
|---|---|---|---|
| 8,958,143 B2 * | 2/2015 | Hou | ........................ H01S 3/076 250/504 R |
| 9,240,669 B2 | 1/2016 | Papadopoulos et al. | |
| 9,516,732 B2 | 12/2016 | Wagner et al. | |
| 2003/0156605 A1 * | 8/2003 | Richardson | ......... H01S 3/06791 372/25 |
| 2005/0205811 A1 | 9/2005 | Partlo et al. | |
| 2007/0291350 A1 | 12/2007 | Ershov et al. | |
| 2010/0272137 A1 | 10/2010 | Kopf et al. | |
| 2014/0050235 A1 | 2/2014 | Clowes et al. | |
| 2014/0218706 A1 | 8/2014 | Wagner et al. | |

FOREIGN PATENT DOCUMENTS

| | | |
|---|---|---|
| JP | 2014-521219 A | 8/2014 |
| JP | 2014-527273 A | 10/2014 |
| JP | 2014-531704 A | 11/2014 |

OTHER PUBLICATIONS

Liao et al., "Generation of hard X-rays using an ultrafast fiber laser system," Optical Society of America, Optics Express, vol. 15, No. 21, 2007; pp. 13942-13948.

Tanino et al., "Highly-efficient high-power pulsed CO2 laser characterized by transverse-flow laser amplifiers," Proc. of SPIE, vol. 9048, Extreme Ultraviolet (EUV) Lithography V, Apr. 17, 2014; pp. 1-8.

Mizoguchi et al., "$1_{st}$ generation Laser-Produced Plasma source system for HVM EUV lithography," Proc. of SPIE, vol. 7636, Extreme Ultraviolet (EUV) Lithography, Mar. 19, 2010; 10 pages.

Brandt et al., "Laser-Produced Plasma Light Sources for EUV Lithography," Solid State Technology, vol. 55, No. 5, Jun. 2012; 5 pages.

* cited by examiner

RADIATION SOURCE

CROSS-REFERENCE TO RELATED APPLICATIONS

This application claims priority of EP application 15155798.0 which was filed on 19 Feb. 2015 and which is incorporated herein in its entirety by reference.

FIELD

The present invention relates to a laser system. The present invention has particular, but not exclusive, use within radiation sources for producing an EUV radiation generating plasma.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation may be produced using a radiation source arranged to generate an EUV producing plasma. An EUV producing plasma may be generated, for example, by exciting a fuel, for example liquid tin, within the radiation source. The fuel may be excited by directing a beam of initiating radiation, such as a laser beam, at a target comprising the fuel, the initiating radiation beam causing the fuel target to become an EUV generating plasma.

It is desirable to provide an EUV radiation source which obviates or mitigates one or more of the problems of the prior art, whether identified herein or elsewhere.

SUMMARY

According to a first aspect there is provided a laser system comprising a seed module operable to emit a pulse of a first laser beam followed by a pulse of a second laser beam and a plurality of amplification chambers each comprising a gain medium having a gain, wherein the plurality of amplification chambers are arranged to receive the pulse of the first laser beam and amplify the first laser beam in a second order and wherein the plurality of amplification chambers are further arranged to receive the pulse of the second laser beam and amplify the second laser beam in a first order which is the reverse of the second order According to a second aspect there is provided a laser system comprising a seed module operable to emit a pulse of a first laser beam followed by a pulse of a second laser beam, a plurality of amplification chambers each comprising a gain medium having a gain and an optical guiding system, wherein the optical guiding system is constructed and arranged to direct the pulse of the first laser beam through the plurality of amplification chambers in a second order to amplify the first laser beam, and wherein the optical guiding system is constructed and arranged to direct the pulse of the second laser beam through the plurality of amplification chambers in a first order which is the reverse of the second order to amplify the second laser beam.

In the first and/or second aspect, by arranging the amplification chambers to receive the first laser beam in the second order and to receive the second laser beam in the first order, an amount of gain which is available in the amplification chambers to amplify a reflection of the first laser beam (passing through the amplification chambers in the first order) is reduced. A reduction of the gain which is available to amplify the reflection of the first laser beam causes a reduction in the power of the reflection of the first laser beam after having passed through the amplification chambers. This advantageously reduces any damage which may be caused to components of the laser system by the reflection of the first laser beam.

The gain media in the amplification chambers may be configured such that propagation of the pulse of the first laser beam through the amplification chambers causes gain stripping in at least some of the amplification chambers.

Gain stripping which is caused by propagation of the first laser beam through the amplification chambers advantageously reduces the gain which is available in the amplification chambers to amplify a reflection of the first laser beam.

A saturation power of each of the gain media may decrease along the path of the first laser beam through the amplification chambers in the second order.

The gain of each of the gain media may increase along the path of the first laser beam through the amplification chambers in the second order.

The amplification chambers may be configured such that the pulse of the first laser beam experiences a total amplification during its passage through the amplification chambers which is less than the total amplification which is experienced by the pulse of the second laser beam during its passage through the amplification chambers.

The seed module may be configured to emit a pulse of the first laser beam having a first power and a pulse of the second laser beam having a second power which is greater than the first power.

The seed module may be configured to emit a pulse of the first laser beam having a first wavelength and a pulse of the second laser beam having a second wavelength which is different to the first wavelength.

The laser system may further comprise an optical isolator arranged in the optical path of the first laser beam and between the seed module and the amplification chambers, wherein the optical isolator is configured to prevent a reflection of the first laser beam from entering the seed module.

The optical isolator may also be arranged in the optical path of the second laser beam and may additionally be configured to prevent a reflection of the second laser beam from entering the seed module.

The seed module may be configured to emit a polarised first laser beam having a first polarisation state.

The optical isolator may comprise a polariser configured to transmit radiation having the first polarisation state.

The amplification chambers may comprise a gas.

The gas may comprise carbon dioxide.

The amplification chambers may further comprise a radio frequency power source configured to pump the gas by electrical discharge.

According to a third aspect there is provided a radiation source comprising a fuel emitter configured to emit a fuel and direct the fuel so as to provide a fuel target and an initiating radiation source comprising a laser system according to any of claims 1-14 and a beam delivery system configured to direct the amplified first laser beam and the amplified second laser beam to be incident on the fuel target.

The fuel may comprise tin.

The first laser beam may be configured to alter the shape of the fuel target.

The second laser beam may be configured to excite the fuel target to form a plasma which emits EUV radiation.

According to a fourth aspect there is provided a lithographic system comprising a radiation source according to the third aspect and a lithographic apparatus arranged to receive a radiation beam from the radiation source, the lithographic apparatus comprising an illumination system configured to condition the radiation beam received from the radiation source, a support structure constructed to support a patterning device, the patterning device being capable of imparting the radiation beam with a pattern in its cross-section to form a patterned radiation beam, a substrate table constructed to hold a substrate and a projection system configured to project the patterned radiation beam onto the substrate.

According to a fifth aspect there is provided a method of providing first and second laser beams, the method comprising emitting a pulse of a first laser beam, directing the pulse of the first laser beam through a plurality of amplification chambers each comprising a gain medium in a second order, emitting a pulse of a second laser beam, directing the pulse of the second laser beam through the plurality of amplification chambers in a first order which is the reverse of the second order.

The gain media in the amplification chambers may be configured such that propagation of the pulse of the first laser beam through the amplification chambers causes gain stripping in at least some of the amplification chambers.

A saturation power of each the gain media may decrease along the path of the first laser beam through the amplification chambers in the second order.

The gain of each of the gain media may increase along the path of the first laser beam through the amplification chambers in the second order.

The pulse of the first laser beam may experience a total amplification during its passage through the amplification chambers which is less than the total amplification which is experienced by the pulse of the second laser beam during its passage through the amplification chambers.

The pulse of the first laser beam may have a first power and the pulse of the second laser beam may have a second power which is greater than the first power.

The pulse of the first laser beam may have a first wavelength and the pulse of the second laser beam may have a second wavelength which is different to the first wavelength.

It will be appreciated that one or more aspects or features described in the preceding or following descriptions may be combined with one or more other aspects or features.

BRIEF DESCRIPTION OF THE DRAWINGS

Embodiments of the invention will now be described, by way of example only, with reference to the accompanying schematic drawings, in which.

DETAILED DESCRIPTION

Figure 1:
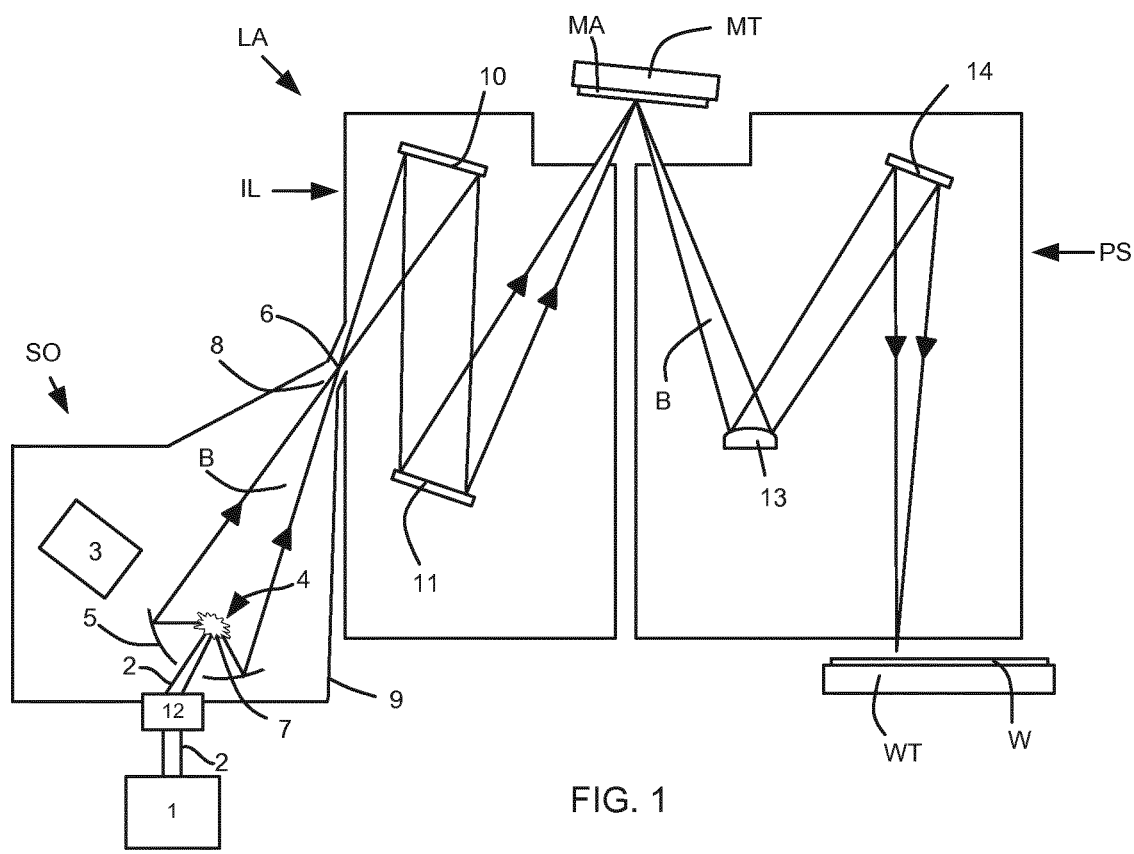
FIG. 1 is a schematic illustration of a lithographic system comprising a lithographic apparatus and an initiating radiation source according to an embodiment of the invention.

FIG. 1 shows a lithographic system including a radiation source SO according to one embodiment of the invention. The lithographic system further comprises a lithographic apparatus LA. The radiation source SO is configured to generate an extreme ultraviolet (EUV) radiation beam B and may therefore be referred to as an EUV radiation source. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The EUV radiation source SO, illumination system IL, and projection system PS may all be constructed and arranged such that they can be isolated from the external environment. A gas at a pressure below atmospheric pressure (e.g. hydrogen) may be provided in the EUV radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The EUV radiation source SO shown in FIG. 1 is of a type which may be referred to as a laser produced plasma (LPP) source. An initiating radiation source 1 is arranged to deposit energy via a laser beam 2 into a fuel, which is provided from a fuel emitter 3. The laser beam 2 may be referred to as an initiating radiation beam. The laser beam 2 is directed to be incident on the fuel by a beam delivery system 12. The fuel may for example be in liquid form, and may for example be a metal or alloy, such as tin (Sn). Although tin is referred to in the following description, any suitable fuel may be used. The fuel emitter 3 is configured to emit a fuel and direct the fuel to a plasma formation region 4 so as to provide a fuel target at the plasma formation region 4. The fuel emitter 3 may comprise a nozzle configured to direct tin, e.g. in the form of droplets, along a trajectory towards the plasma formation region 4. The laser beam 2 is incident upon the tin at the plasma formation region 4. The deposition of laser energy into the tin excites the tin to form a plasma 7 at the plasma formation region 4. Radiation, including EUV radiation, is emitted from the plasma 7 during de-excitation and recombination of ions of the plasma. The initiating radiation source 1 may be used in a pulsed configuration, such that the laser beam 2 is a laser pulse. Where the fuel is provided as a droplet, a respective laser pulse may be directed at each fuel droplet.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The initiating radiation source 1 may be separated from the radiation source SO. Where this is the case, the laser beam 2 may be passed from the initiating radiation source 1 to the radiation source SO with the aid of the beam delivery system 12. The initiating radiation source 1 and the EUV radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The EUV radiation source SO is arranged such that the intermediate focus 6 is located at or near to an opening 8 in an enclosing structure 9 of the EUV radiation source SO.

The radiation beam B passes from the EUV radiation source SO into the illumination system IL, which is configured to condition the radiation beam B. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may, for example, be applied. Although the projection system PS has two mirrors 13, 14 in FIG. 1, the projection system may include any number of mirrors.

Figure 2:
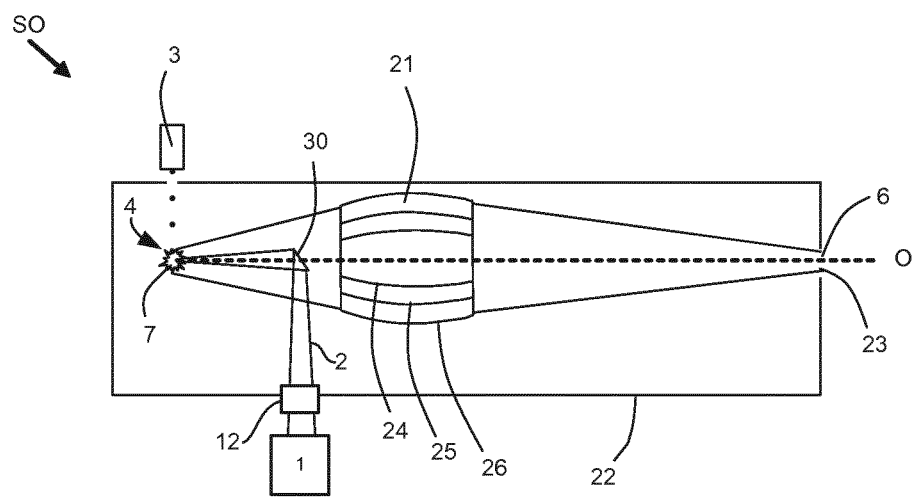
FIG. 2 is a schematic illustration of an alternative EUV radiation source comprising an initiating radiation source according to an embodiment of the invention.

FIG. 2 shows a laser produced plasma (LPP) EUV radiation source SO which has an alternative configuration to the radiation source shown in FIG. 1. The EUV radiation source SO includes a fuel emitter 3 which is configured to deliver fuel to a plasma formation region 4. The fuel may for example be tin, although any suitable fuel may be used. An initiating radiation source 1 emits a laser beam 2. The laser beam 2 is directed by a beam delivery system 12 to be incident on the fuel at a plasma formation region 4. A mirror 30 is used to direct the laser beam 2 to the plasma formation region 4. The laser beam 2 delivers energy to the fuel and thereby converts the fuel into an EUV radiation emitting plasma 7.

A radiation collector 21, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 22 of the radiation source SO includes an opening 23 which is at or near to the intermediate focus 6. The EUV radiation passes through the opening 23 to an illumination system of a lithographic apparatus (e.g. of the form shown schematically in FIG. 1).

The radiation collector 21 may be a nested collector, with a plurality of grazing incidence reflectors 24, 25 and 26 (e.g. as schematically depicted). The grazing incidence reflectors 24, 25 and 26 may be disposed axially symmetrically around an optical axis O. The illustrated radiation collector 21 is shown merely as an example, and other radiation collectors may be used.

The EUV radiation sources SO shown in FIGS. 1 and 2 may include components which are not illustrated. For example, one or more contaminant traps may be included in the EUV radiation sources SO shown in FIGS. 1 and 2. A contaminant trap may be configured to prevent debris which may be emitted from a plasma formation region 4 from contaminating a radiation collector 5, 21. Additionally or alternatively a spectral filter may be provided in a radiation source. The spectral filter may be substantially transmissive for EUV radiation but substantially blocking for other wavelengths of radiation such as infrared radiation.

Figure 3:
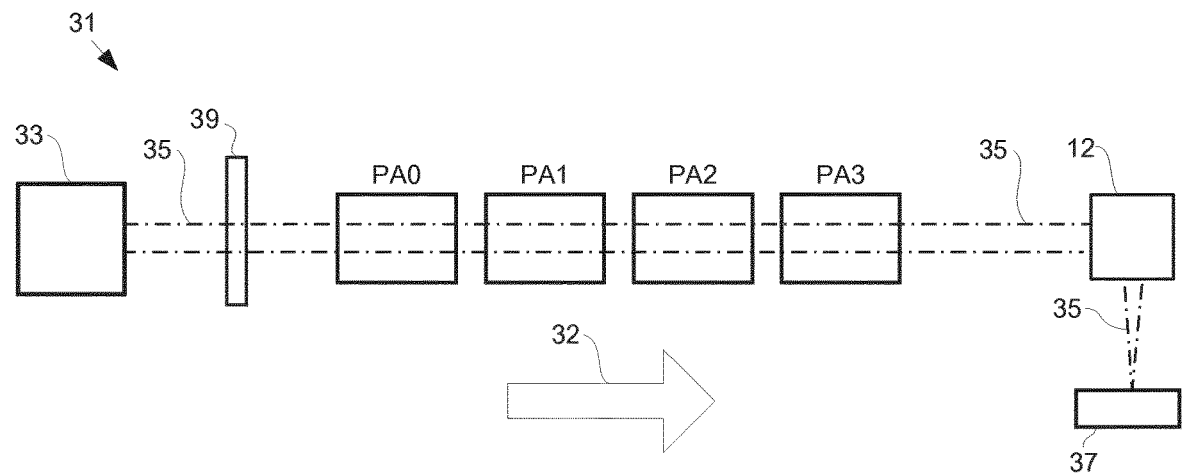
FIG. 3 is a schematic illustration of an initiating radiation source.

FIG. 3 schematically illustrates an initiating radiation source 31 which is arranged to provide a pulsed laser beam 35. The pulsed laser beam 35 is directed by a beam delivery system 12 to be incident on a fuel target 37. The fuel target 37 may, for example, be a droplet of fuel at a plasma formation region 4 (e.g. the plasma formation regions 4 shown in the radiation sources SO depicted in FIGS. 1 and 2). The beam delivery system 12 may comprise one or more optical components (e.g. mirrors and/or lenses) which are configured to direct and focus the laser beam 35 onto the fuel target 37.

The initiating radiation source 31 comprises a seed module 33 and four amplification chambers PA0, PA1, PA2, PA3. Each of the amplification chambers PA0, PA1, PA2, PA3 comprises a gain medium. The gain media in the amplification chambers PA0, PA1, PA2, PA3 are pumped in order to bring about a state of population inversion within the gain media such that a laser beam which propagates through the gain media may experience a gain. The gain media may, for example, comprise a gas. In an embodiment the gas may include $CO_2$. In such an embodiment the initiating radiation source may comprise a $CO_2$ laser in a master oscillator power amplifier (MOPA) arrangement. In some embodiments a gas which forms the gain media may, for example, comprise helium and/or nitrogen. In some embodiments a gas which forms the gain media may comprise a mixture of different gases. For example, a gain medium may comprise a mixture of $CO_2$, helium and nitrogen. The gain media may be pumped by electrical discharge. For example, a gain media comprising gas may be pumped with a radio frequency (RF) power source.

The seed module 33 emits a seed laser beam 35. In the example which is shown in FIG. 3 the seed laser beam 35 propagates through the amplification chambers in the order PA0, PA1, PA2, PA3 as indicated by the arrow 32 which is shown in FIG. 3. The order of propagation of the laser beam 35 through the amplification chambers which is shown in FIG. 3 may be referred to as a first order of propagation.

The seed laser beam 35 initially propagates through the amplification chamber PA0 and interacts with the gain medium within the amplification chamber PA0, thereby increasing the power of the laser beam 35 by stimulated emission. The power of the laser beam is further increased by amplification in each of the amplification chambers PA1, PA2, PA3 so as to form a laser beam which is output from the amplification chamber PA3 having a higher power than the seed laser beam 35 which is input to the amplification chamber PA0. By controlling the optical gain medium within each of the chambers PA0, PA1, PA2, PA3, and the path of the laser beam, the laser beam proceeds through the amplification chambers PA0, PA1, PA2 and PA3, to exit the initiating radiation source 31 at a desired power.

As was described above the laser beam 35 which is output from the initiating radiation source is directed by a beam delivery system 12 to be incident on a fuel target 37. The fuel target 37 may be a droplet of fuel positioned at a plasma formation region 4 which is excited by the laser beam 35 so as to form an EUV radiation emitting plasma 7. Typically, the seed module 33 emits a pulsed seed laser beam 35 such that the laser beam which is output from the initiating radiation source 31 comprises a series of pulses. Pulses of the laser beam 35 may, for example, arrive at a plasma formation region 4 at a time which coincides with the arrival of a droplet of fuel at the plasma formation region 4.

In order to improve a conversion efficiency (CE) with which energy from the laser beam 35 is converted to EUV radiation, the fuel target 37 may initially be illuminated with a pre-pule laser beam before being illuminated by a main pulse laser beam. For example, a pre-pulse laser beam may be generated and directed at the fuel target 37 in order to change a property of the fuel target 37 such as its size and/or shape, before a main-pulse, plasma generating, laser beam is directed at the fuel target 37. A main-pulse may be incident on the fuel target 37, for example, approximately 2 µs after a pre-pulse is incident on the fuel target 37. The pre-pulse laser beam and the main-pulse laser beam may, for example, have repetition rates of approximately 50 kHz. The duration of pulses of the pre-pulse and main-pulse laser beams may be different from each other. For example, a pulse of the pre-pulse laser beam may have a duration of approximately 40 ns. A pulse of the main-pulse laser beam may have a duration of approximately 130-200 ns.

The pre-pulse and the main-pulse laser beams may both be generated by the initiating radiation source 31. For example, the seed module 33 may initially emit a pulse of a pre-pulse laser beam which propagates through the amplification chambers and may subsequently emit a pulse of a main-pulse laser beam which also propagates through the amplification chambers.

The pre-pulse and main-pulse laser beams which are emitted by the seed module may have different wavelengths. The wavelengths of the pre-pulse and main-pulse laser beams may, for example, correspond to different rotational and/or vibrational transitions in a gas which forms the gain media of the amplification chambers. For example, in an embodiment the wavelengths of the pre-pulse and main-pulse laser beams may correspond to different rotational and/or vibrational transitions in a gain medium which comprises $CO_2$. In such an embodiment the pre-pulse laser beam may have a wavelength of approximately 10.26 µm and the main-pulse laser beam may have a wavelength of approximately 10.59 µm. The different wavelengths of the pre-pulse and main-pulse which are emitted by the seed module 33 may experience different gains in the amplification chambers PA0-PA3 which may result in the pre-pulse and the main-pulse which are output from the initiating radiation source 1 having different powers. For example, a pre-pulse laser beam may be amplified to a power of approximately 3-5 kW and a main-pulse laser beam may be amplified to a power of approximately 25 kW.

The optical path of the laser beam 35 may include one or more optical coatings whose transmission is a function of a wavelength. A pre-pulse having a different wavelength to a main-pulse may therefore experience a different transmission along its optical path which may further contribute to the difference in power between the pre-pulse and the main-pulse.

The difference in power between the pre-pulse and main-pulse laser beams may additionally result from different powers of pulses which are emitted from the seed module 33. For example, the seed module 33 may emit a pre-pulse having a power which is lower than the power of a main-pulse which is subsequently emitted by the seed module.

In a prior art initiating radiation source a pre-pulse laser beam propagates through the amplification chambers in the same order as the order in which a main-pulse laser beam propagates through the amplification chambers. For example, both a main-pulse laser beam and a pre-pulse laser beam may propagate through the amplification chambers in the first order which is depicted by the arrow 32 which is shown in FIG. 3.

A pre-pulse which is output from the initiating radiation source 31 is focussed onto the fuel target 37 by a beam delivery system 12. A fraction of the pre-pulse may be reflected from the fuel target 37 such that it returns along the same optical path and back into the initiating radiation source 31. A reflected pre-pulse which re-enters the initiating radiation source 31 may propagate through the amplification chambers and may be amplified in the amplification chambers.

If a reflected pre-pulse which is amplified in the amplification chambers is allowed to enter the seed module 33 then this may cause damage to the seed module 33. In order to reduce the amount of radiation from a reflected pre-pulse which enters the seed module 33 an optical isolator 39 is positioned in the optical path between the amplification chamber PA0 and the seed module 33. The optical isolator 39 may, for example, be a polariser. The pre-pulse which is emitted from the seed module 33 may be linearly polarised. The optical isolator 39 in the form of a polariser may be configured to transmit radiation having the linear polarisation state of the pre-pulse which is emitted from the seed module 33 such that the pre-pulse is transmitted by the optical isolator 39 and propagates through the amplification chambers PA0-PA3.

Reflection of the pre-pulse from the fuel target 37 may alter the polarisation state of the pre-pulse such that a reflected pre-pulse has a different polarisation state to the polarisation state of the pre-pulse which is incident on the fuel target 37. A reflected pre-pulse which is incident on the optical isolator 39 may therefore not be transmitted by the optical isolator 39 and thus may be prevented from entering the seed module 33 and causing damage to the seed module 33.

In an embodiment, the pre-pulse laser beam may be incident on an optical component which alters the polarisation state of the pre-pulse laser beam after having passed through the optical isolator 39. For example, the pre-pulse laser beam may be incident on a mirror which induces a phase retardance in the pre-pulse laser beam such that the pre-pulse laser beam becomes circularly or elliptically polarised. The direction of rotation of the circular or elliptical polarisation state of the pre-pulse laser beam may be reversed during reflection of the pre-pulse laser beam at the fuel target 37. The reflected pre-pulse laser beam may subsequently be incident on the mirror which induces a phase retardance in the reflected pre-pulse laser beam such that the reflected pre-pulse laser beam becomes linearly polarised. The linear polarisation state of the reflected pre-pulse laser beam may however be orthogonal to the linear polarisation state of the pre-pulse laser beam which is emitted from the seed module 33 (due to the reversal of the direction of rotation of the circular or elliptical polarisation of the pre-pulse laser beam which occurs during reflection at the fuel target 37). The reflected pre-pulse laser beam may therefore not be transmitted by the optical isolator 39 and thus may be prevented from entering the seed module 33 and causing damage to the seed module 33.

In other embodiments the optical isolator 39 may take a form other than a polariser. In general the optical isolator 39 may be any component or combination of components configured to prevent the reflected pre-pulse laser beam from entering the seed module 33.

If a reflected pre-pulse is substantially amplified in the amplification chambers PA0-PA3 then the power of a reflected pre-pulse which is incident on the optical isolator 39 may be sufficient to cause damage to the optical isolator 39. Damage to the optical isolator 39 may reduce the effectiveness of the optical isolator 39 in preventing reflected pre-pulses from entering the seed module 33. Substantial amplification of a reflected pre-pulse in the amplification chambers PA0-PA3 may therefore cause damage to the optical isolator 39 which may result in damage to the seed module 33. It is therefore desirable to reduce the amplification of a reflected pre-pulse in the amplification chambers.

A further problem which may be caused by a reflected pre-pulse is a temporary reduction of the gain of the amplification chambers PA0-PA3. This effect may be referred to as gain stripping. Gain stripping may be caused by a temporary depletion of the population inversion in the amplification chambers PA0-PA3. When a pulse of laser radiation propagates through a gain medium, energy from the gain medium is used to amplify the pulse of laser radiation. The energy which is stored by the gain medium is therefore reduced by a laser pulse propagating through the gain medium. The gain of a gain medium is related to the energy which is stored by the gain medium and thus a pulse of laser radiation which propagates through a gain medium serves to temporarily reduce the gain of the gain medium. After the pulse of laser radiation has passed through the gain medium the gain increases again due to pumping of the gain medium (e.g. by electrical discharge). However the increase in the gain is not instantaneous and thus there is a period of time after propagation of a pulse of laser radiation through a gain medium during which the gain is reduced.

A pre-pulse which is emitted from the seed module 33 and propagates through the amplification chambers PA0-PA3 therefore causes a temporary reduction in the gain of the amplification chambers PA0-PA3. The period of time between propagation of the pre-pulse through the amplification chambers PA0-PA3 and the emission of a main-pulse from the seed module 33 may be sufficient to allow the gain of the amplification chambers to recover such that the gain which is experienced by the main-pulse is not substantially reduced by the propagation of the pre-pulse through the amplification chambers PA0-PA3. However, in the event that radiation from the pre-pulse is reflected from the fuel target 37 and passes back through the amplification chambers PA0-PA3 the gain in the amplification chambers may be further reduced by amplification of the reflected pre-pulse. This may leave insufficient time between a reflected pre-pulse propagating back through the amplification chambers PA0-PA3 and the emission of a main-pulse from the seed module 33 for the gain of the amplification chambers to fully recover. The gain which is experienced by a main pulse propagating through the amplification chambers PA0-PA3 may therefore be reduced by reflection of a pre-pulse from the fuel target 37. A reduction in the gain which is experienced by the main-pulse causes a reduction in the power of the main-pulse which is incident on the fuel target 37 and will therefore disadvantageously reduce the amount of energy which is deposited into the fuel target. It is therefore desirable to decrease the gain stripping which is caused by the propagation of a reflected pre-pulse through the amplification chambers PA0-PA3.

Figure 4A:
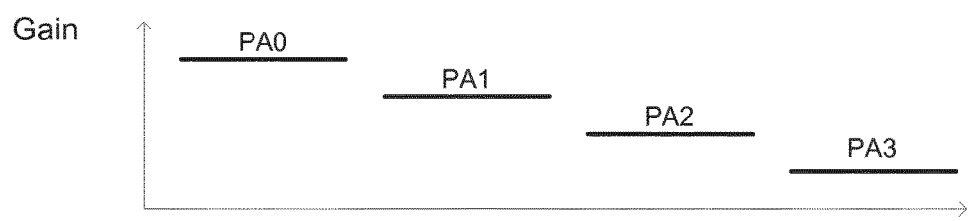
FIGS. 4A and 4B are representations of a gain and a saturation power in amplification chambers in an initiating radiation source.
Figure 4B:
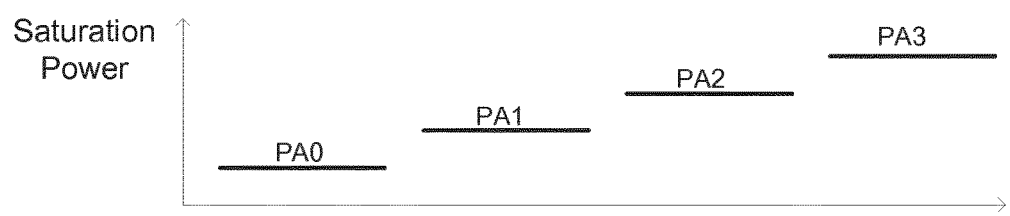

Typically the gains of the amplification chambers PA0-PA3 are different from each other. FIG. 4A is a representation of the gains in each of the amplification chambers PA0-PA3 in an embodiment of an initiating radiation source. FIG. 4B is a representation of a saturation power in each of the amplification chambers PA0-PA3 in the same embodiment of the initiating radiation source for which the gains are shown in FIG. 4A.

The saturation power of a gain medium is the power of a laser beam which when in a steady state leads to a halving of the gain of the gain medium (when compared to the case of a laser beam with sufficiently low power that no gain stripping occurs). The saturation power of a gain medium may be thought of as a measure of the amount of gain stripping which results from propagation of a laser beam having a given power through the gain medium (assuming that the power of the laser beam is sufficiently high to cause gain stripping in the gain medium). That is, for a laser beam having a given power propagating through a gain medium, a reduction in the saturation power of the gain medium will cause an increase in the amount by which the gain is stripped by the laser beam. Conversely an increase in the saturation power of the gain medium will cause a decrease in the amount by which the gain is stripped by the laser beam.

Alternatively the saturation power of a gain medium may be thought of as a measure of the power of a laser beam which must propagate through a gain medium in order to cause a given amount of gain stripping in the gain medium. That is, a gain medium having a relatively low saturation power will experience a given amount of gain stripping if a laser beam of relatively low power propagates through the gain medium. Conversely a gain medium having a relatively high saturation power may experience the same given amount of gain stripping if a laser beam of relatively high power propagates through the gain medium.

The gain and the saturation power in each amplification chamber PA0-PA3 is a function of a number of operational parameters and design characteristics of the amplification chambers. For example, the gain and the saturation power of each amplification chamber may be a function of the pump power which is supplied to the gain media in the amplification chambers PA0-PA3. Additionally or alternatively, the gain and saturation power in the amplification chambers PA0-PA3 may be a function of properties of the gain media in the amplification chambers PA0-PA3. For example, in an embodiment in which the gain media in the amplification chambers PA0-PA3 comprises a gas, the gain and saturation power in the amplification chambers may be a function of the pressure of the gas in the chambers, the mixing of the gas in the chambers and/or the flow rate of gas through the chambers. The operational parameters of each amplification chamber may be varied in order to vary the gain and saturation power in each chamber.

The saturation power of the amplification chambers PA0-PA3 may be additionally dependent on the cross-section of the laser beam which propagates through the amplification chambers PA0-PA3 and on the cross-sections of the gain media in the amplification chambers PA0-PA3.

In the embodiment which is shown in FIGS. 4A and 4B, the gain of the amplification chambers decreases from PA0 to PA3 and the saturation power of the amplification chambers increases from PA0 to PA3. The gain and saturation powers of each of the amplification chambers which is shown in FIGS. 4A and 4B is advantageous for the amplification of a laser beam pulse (e.g. a pre-pulse or a main-pulse) which passes through the amplification chambers in the first order (i.e. in the order PA0, PA1, PA2, PA3). Passing a laser beam through the amplification chambers in the first order is advantageous for the amplification of a laser beam because as the laser beam passes through the amplification chambers and is amplified such that its power increases, the saturation power of the amplification chambers also increases. An increase in saturation power with an increase in power of the laser beam reduces the gain stripping which occurs in the amplification chambers and therefore increases the gain which is experienced by a laser beam propagating through the amplification chambers in the first order.

A pre-pulse laser beam which passes through the amplification chambers in the first order therefore leads to relatively little gain stripping in the amplification chambers PA0-PA3. Whilst a relatively low saturation of the gain caused by the pre-pulse is advantageous for the amplification of a subsequent main-pulse which passes through the amplification chambers, a relatively low saturation of the gain by the pre-pulse results in a relatively large amount of gain remaining in the amplification chambers which may amplify a reflected pre-pulse which passes back through the amplification chambers. This may therefore result in a reflected pre-pulse which is reflected from the fuel target 37 being amplified to a relatively high power which may cause damage to the optical isolator 39 and the seed module 33.

Figure 5:
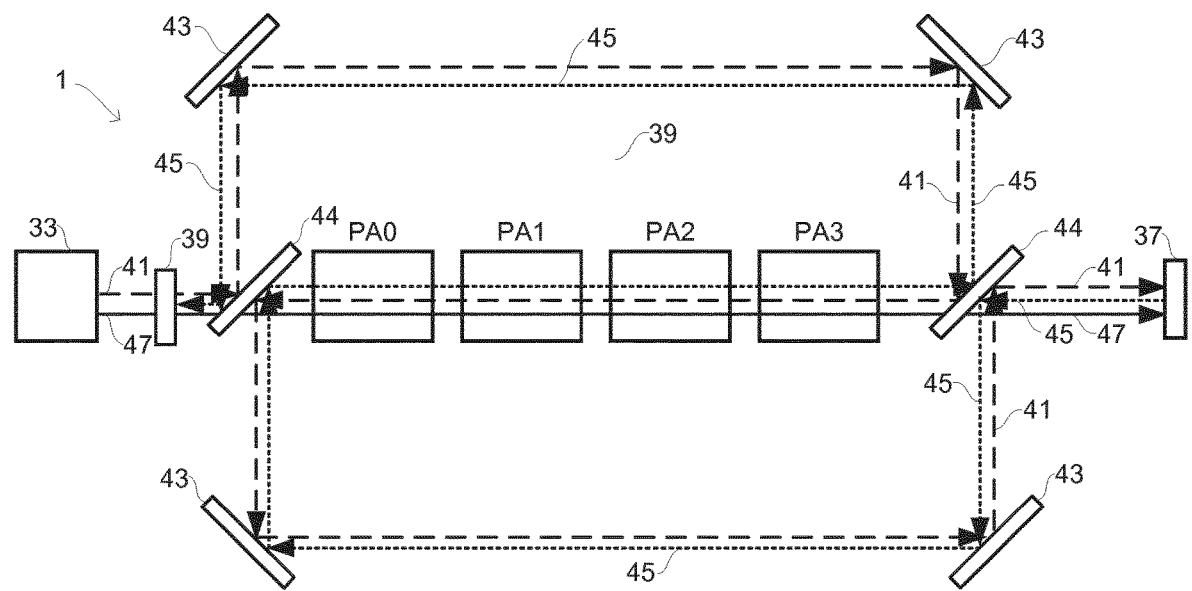
FIG. 5 is a schematic illustration of an initiating radiation source according to an embodiment of the invention.

FIG. 5 is a schematic illustration of an initiating radiation source 1 according to an embodiment of the invention. The initiating radiation source comprises a seed module 33 and four amplification chambers PA0-PA3. The initiating radiation source also has an optical guiding system which, in the embodiment of FIG. 5, includes mirrors 43 which are configured to direct laser pulses around the initiating radiation source 1. The amplification chambers PA0-PA3 are configured such that they have the gain and saturation powers which are shown in FIGS. 4A and 4B. The gain and saturation powers of the amplification chambers PA0-PA3 are configured for amplification of a main-pulse laser beam 47 which passes through the amplification chambers in the first order.

The seed module 33 emits a first pulse, in the embodiment of FIG. 5 a pre-pulse laser beam 41 which is shown a dashed line. The pre-pulse laser beam 41 comprises a series of pulses which are directed to propagate through the amplification chambers in the order PA3, PA2, PA1, PA0. The order with which the pre-pulse laser beam 41 passes through the amplification chambers may be referred to as a second order. The second order is the reverse of the first order. The pre-pulse laser beam 41 propagates through the amplification chamber PA3, having the lowest gain and highest saturation power, first and propagates through the amplification chamber PA0, having the highest gain and the lowest saturation power, last. The saturation power of the gain medium through which the pre-pulse laser beam 41 propagates therefore decreases as the pre-pulse laser beam 41 is amplified and its power increases. As will be described in further detail below this causes substantial gain stripping to occur in at least some of the amplification chambers.

The amplified pre-pulse laser beam 41 is directed to be incident on a fuel target 37. The fuel target reflects a portion of the pre-pulse laser beam 41 to form a reflected pre-pulse laser beam 45 which is shown in FIG. 5 as a dotted line. For ease of illustration, the pre-pulse laser beam 41 and the reflected pre-pulse laser beam 45 are shown in FIG. 5 as being physically separated from one another. However, in practice the reflected pre-pulse laser beam 45 may return along substantially the same optical path as the pre-pulse laser beam 41.

In order for the optical guiding system to be able to be able direct the series of pulses of the the pre-pulse laser beam 41 through the amplification chambers in an order which is the reverse of the order in which the optical guiding system is able to direct the series of pulses of the main-pulse laser beam 47 through the amplification chambers, the optical guiding system, in the embodiment of FIG. 5, is provided with mixing optics 44.

Before and after passing through the amplification chambers PA0-PA3, the pre-pulse laser beam 41 and the reflected pre-pulse laser beam 45 are reflected by the mixing optics 44. The mixing optics 44 may, for example, comprise a reflective coating which substantially reflects radiation having the wavelength of the pre-pulse laser beam 41 and substantially transmits radiation having the wavelength of the main-pulse laser beam 47. The coating may, for example, be mounted on a window comprising diamond. The mixing optics 44 are configured to join and/or separate the optical paths of the pre-pulse and main-pulse laser beams.

The reflected pre-pulse laser beam 45 propagates through the amplification chambers in the first order PA0, PA1, PA2, PA3. As will be explained in further detail below, by passing the pre-pulse laser beam 41 through the amplification chambers in the second order PA3, PA2, PA1, PA0 a greater degree of gain stripping occurs (as opposed to passing the pre-pulse laser beam 41 through the amplification chambers in the first order PA0, PA1, PA2, PA3) and thus the reflected pre-pulse laser beam 45 experiences less gain and consequently undergoes a smaller amplification. The reflected pre-pulse laser beam 45 which is incident on the optical isolator 39 therefore advantageously has a lower power and is thus less likely to cause damage to the optical isolator 39.

Passing the pre-pulse laser beam 41 through the amplification chambers in the second order does however result in the pre-pulse laser beam 41 undergoing a smaller amplification (as opposed to passing the pre-pulse laser beam 41 through the amplification chambers in the first order). This smaller amplification can however be overcome by increasing the power of the pre-pulse laser beam 41 which is emitted by the seed module 33 in order for the pre-pulse laser beam 41 which is incident on the fuel target 37 to have a desired power. For example, it may be desirable for the amplified pre-pulse laser beam 41 which is incident on the fuel target 37 to have a power of approximately 4 kW. If the pre-pulse laser beam 41 were to be passed through the amplification chambers in the first order then a pre-pulse laser beam 41 having a power of approximately 5 W may be emitted from the seed module 33 which may be amplified to a power of approximately 4 kW. In the embodiment which is shown in FIG. 5 in which the pre-pulse laser beam 41 passes through the amplification chambers in the second order, the pre-pulse laser beam 41 which is emitted from the seed module 33 may have a power of approximately 160 W which may be amplified to a power of approximately 4 kW.

Figure 6A:
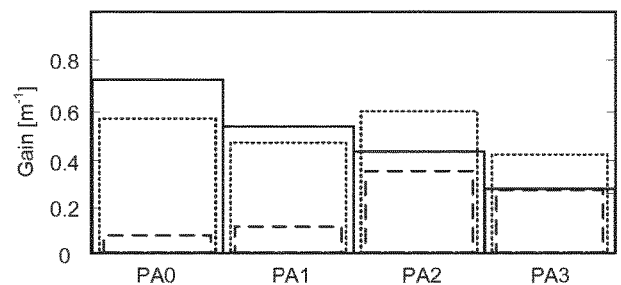
FIGS. 6A and 6B are representations of a gain in amplification chambers in an initiating radiation source.

FIG. 6A is a representation of the gain of each of the amplification chambers at different times when a pulse of the pre-pulse laser beam 41 passes through the amplification chambers in the second order. The solid lines in FIG. 6A represent the initial gain (at the wavelength of the pre-pulse laser beam 41) of each amplification chambers immediately before a pulse of the pre-pulse laser beam 41 propagates through the amplification chambers. The dotted lines in FIG. 6A represent the gain of each amplification chamber (at the wavelength of the pre-pulse laser beam 41) after a pulse of the pre-pulse laser beam 41 has been reflected from the fuel target 37 and immediately before a pulse of the reflected pre-pulse laser beam 45 propagates through the amplification chambers. The dotted lines in FIG. 6A therefore represent the gain which is available to amplify the reflected pre-pulse laser beam 45. The dashed lines in FIG. 6A represent the gain (at the wavelength of the main-pulse laser beam 47) which is available to amplify the main-pulse laser beam 47 after the pre-pulse laser beam 41 and the reflected pre-pulse laser beam 45 have passed through the amplification chambers PA0-PA3.

The pre-pulse laser beam 41 which is emitted from the seed module 33 initially enters the amplification chamber PA3 which has a relatively low gain and a relatively high saturation power (as can be seen from FIGS. 6A and 4B). The relatively low power of the pre-pulse laser beam 41 which enters the amplification chamber PA3 and the relatively high saturation power in the amplification chamber means that relatively little gain stripping occurs in the amplification chamber PA3.

The pre-pulse laser beam 41 is amplified in the amplification chamber PA3 such that it enters the amplification chamber PA2 with a higher power. The amplification chamber PA2 has a higher gain and a lower saturation power than the amplification chamber PA3. The higher power of the pre-pulse laser beam 41 as it enters the amplification chamber PA2 (compared to the power of the pre-pulse laser beam 41 as it enters the amplification chamber PA3) and the lower saturation power of the amplification chamber PA2 results in more gain stripping occurring in the amplification chamber PA2 than in the amplification chamber PA3.

The pre-pulse laser beam 41 is further amplified in the amplification chamber PA2 such that it enters the amplification chamber PA1 with a higher power. The amplification chamber PA1 has a higher gain and a lower saturation power than the amplification chamber PA3 and the amplification chamber PA2. The high power of the pre-pulse laser beam 41 as it enters the amplification chamber PA1 (compared to the power of the pre-pulse laser beam 41 as it enters the amplification chambers PA3 and PA2) and the lower saturation power of the amplification chamber PA1 results in more gain stripping occurring in the amplification chamber PA1 than in the amplification chambers PA3 and PA2. As can be seen in FIG. 6A, the greater gain stripping which occurs in the amplification chamber PA1 results in the gain in the amplification chamber being stripped to a lower gain than the gain in the amplification chambers PA2 and PA3 (despite the gain initially being greater in the amplification chamber PA1).

The pre-pulse laser beam 41 enters the amplification chamber PA0 with a power which is greater than the power with which the pre-pulse laser beam enters any of the other amplification chambers. For example, the power of the pre-pulse laser beam 41 may be approximately 1-2 kW upon entering the amplification chamber PA0. The amplification chamber PA0 has the lowest saturation power of any of the amplification chambers. The combination of the high power of the pre-pulse laser beam as it enters the amplification chamber PA0 and the low saturation power of the amplification chamber PA0 results in a large degree of gain stripping occurring in the amplification chamber PA0. This can be seen from FIG. 6A which shows that relatively little gain remains in the amplification chamber PA0 for amplification of the reflected pre-pulse laser beam 45.

For comparison with FIG. 6A the gain of each of the amplification chambers is shown when a pulse of the pre-pulse laser beam 41 passes through the amplification chambers in the first order (i.e. the order PA0, PA1, PA2, PA3). The gains are shown at the same times as in FIG. 6A and are shown using the same representations.

Figure 6B:
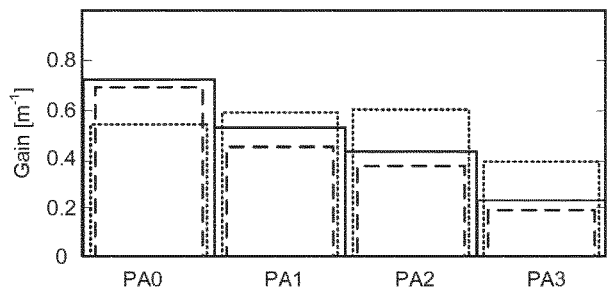

It can be seen from a comparison of FIGS. 6A and 6B that the gain which remains in the amplification chambers PA0 and PA1 and which is available for amplification of the reflected pre-pulse laser beam is much greater after a pulse of the pre-pulse laser beam 41 has passed through the amplification chambers in the first order (as shown in FIG. 6B) than after a pulse of the pre-pulse laser beam 41 has passed through the amplification chambers in the second order (as is shown in FIG. 6A). This is because when the pre-pulse laser beam 41 passes through the amplification chambers in the first order (as shown in FIG. 6B) the pre-pulse laser beam has undergone little amplification and therefore has a relatively low power when it propagates through the amplification chambers PA0 and PA1. The pre-pulse laser beam 41 therefore causes relatively little gain stripping in the amplification chambers PA0 and PA1 and consequently the gain which remains in the amplification chambers PA0 and PA1 is relatively large. Conversely, when the pre-pulse laser beam 41 passes through the amplification chambers in the second order (as shown in FIG. 6A) the pre-pulse laser beam 41 arrives at the amplification chambers PA1 and PA0 having already undergone substantial amplification. The pre-pulse laser beam 41 which passes through the amplification chambers PA1 and PA0 therefore has a high enough power to cause substantial gain stripping in the amplification chambers PA1 and PA0 thereby reducing the gain which is available for amplification of the reflected pre-pulse laser beam 45 in these chambers.

Comparing FIGS. 6A and 6B the gain which is available for amplification of the reflected pre-pulse laser beam 45 in the amplification chambers PA2 and PA3 is slightly higher when a pre-pulse laser beam 41 passes through the amplification chambers in the second order (FIG. 6A) than when a pre-pulse laser beam 41 which passes through the amplification chambers in the first order (FIG. 6B). However the gain which is experienced by the reflected pre-pulse laser beam 45 in the amplification chambers PA0 and PA1 is considerably lower in FIG. 6A than FIG. 6B. This results in the total gain which is experienced by the reflected pre-pulse laser beam 45 being approximately 2.5 times lower for a pre-pulse laser beam 41 which passes through the amplification chambers in the second order (FIG. 6A) than for a pre-pulse laser beam 41 which passes through the amplification chambers in the first order (FIG. 6B).

Passing the pre-pulse laser beam 41 through the amplification chambers in the second order therefore reduces the gain which is experienced by the reflected pre-pulse laser beam 45 (as opposed to passing the pre-pulse laser beam 41 through the amplification chambers in the first order). For example, in an embodiment in which a pre-pulse laser beam 41 is passed through the amplification chambers in the second order, thereby amplifying the pre-pulse laser beam 41 to a power of approximately 4 kW, and approximately 0.1-0.5% of the pre-pulse laser beam 41 is reflected by the fuel target 37, back along the optical path, the reflected pre-pulse laser beam 45 may be amplified to a power of approximately 60-300 W. By comparison, if a pre-pulse laser beam 41 is passed through the amplification chambers in the first order and amplified to a power of approximately 4 kW then the reflected pre-pulse laser beam 45 may be amplified to a power of approximately 1000-2000 W.

Referring again to FIG. 5, the seed module 33 emits a main-pulse laser beam 47 which is directed through the amplification chambers in the first order PA0, PA1, PA2, PA3. Passing the main-pulse laser beam 47 through the amplification chambers in this order advantageously increases the amount of gain which is experienced by the main-pulse laser beam 47 and therefore increases the amount of energy which is deposited into the fuel target by the main-pulse laser beam 47. The seed module may, for example, emit a main-pulse laser beam 47 which has a power of approximately 400 W. The main-pulse laser beam 47 may be amplified by the amplification chambers to a power of approximately 24 kW.

A portion of the main-pulse laser beam 47 may be reflected from the fuel target 37. However in some embodiments in which the fuel target is approximately disk shaped, when the main-pulse laser beam 47 is incident on the fuel target 37, the fuel target may be tilted with respect to the direction of propagation of the main-pulse laser beam 47 such that the main-pulse laser beam 47 is not reflected back along the same optical path. A reflection of the main-pulse laser beam 47 may therefore not be directed back through the beam delivery system 12 and may not re-enter the initiating radiation source 1.

It can be seen from a comparison of FIGS. 6A and 6B is that a further advantage of passing the pre-pulse laser beam 41 through the amplification chambers PA0-PA3 in the second order (as shown in FIG. 6A) as opposed to the first order (as shown in FIG. 6B) is that the amount of gain which remains for amplification of the main-pulse laser beam 47 (shown with dotted lines in FIGS. 6A and 6B) is increased. Consequently the amount energy which is deposited into the fuel target 37 by the main pulse laser beam 47 is increased.

As was explained above, passing the pre-pulse laser beam 41 through the amplification chambers in the second order (as opposed to the first order) causes the gain in the amplification chambers to be saturated so as to reduce the gain which remains in the amplification chambers to amplify the reflected pre-pulse laser beam 45. The reduced amplification of the reflected pre-pulse laser beam 45 means that the reflected pre-pulse laser beam 45 which passes through the amplification chambers has a reduced power. The reduced power of the reflected pre-pulse laser beam 45 has the effect of reducing gain saturation caused by the reflected pre-pulse laser beam 45 passing through the amplification chambers. Therefore, whilst the gain saturation which is caused by the pre-pulse laser beam 41 is increased, the gain saturation which is caused by the reflected pre-pulse laser beam 45 may be decreased. In some embodiments, the net effect of this may be that after the pre-pulse 41 and the reflected pre-pulse 45 have passed through the amplification chambers the gain which remains in the amplification chambers is increased. That is, by passing the pre-pulse laser beam 41 through the amplification chambers in the second order (as opposed to the first order) the gain which is experienced by the main-pulse laser beam 47 may be increased and thus the energy which is deposited into the fuel target by the main-pulse laser beam 47 may be increased.

An additional advantage of passing the pre-pulse laser beam 41 through the amplification chambers in the second order is that the propensity of the initiating radiation source 1 to self-lase may be reduced. Self-lasing is an effect which may occur if radiation is successively reflected and amplified in the initiating radiation source 1. For example, particles which are in the optical path of laser radiation in the initiating radiation source 1 may cause back-scattering of the laser radiation within the radiation source 1. Additionally or alternatively marks or abrasions (e.g. scratches) on components of the amplification chambers may cause reflection of laser radiation within the radiation source 1. In the event that laser radiation is successively back-scattered within the initiating radiation source then a laser cavity may be established in the initiating radiation source. Such a cavity may be referred to as a parasitic cavity. Laser radiation which is successively back-scattered in a parasitic cavity may be amplified by a gain medium in the parasitic cavity and may cause a parasitic laser beam to be established. Self-lasing may occur with or without the provision of pulses emitted from the seed module.

Self-lasing may occur in the initiating radiation source 1 if the following condition is satisfied:

$$g_l e^{2L(g-l)} \geq 1 \qquad (1)$$

where $g_l$ is the glint of a parasitic cavity (equal to the product of the reflectivity at either end of the cavity), g is the gain in the cavity, l is the loss in the cavity and L is the length of the cavity. Self-lasing in the initiating radiation source 1 may result in the establishment of an undesirable laser beam in the initiating radiation source 1 which may cause damage in the initiating radiation source 1. It may therefore be desirable to prevent self-lasing from occurring in the initiating radiation source 1. Self-lasing may be prevented by ensuring that the glint $g_l$ in the initiating radiation source 1 remains below a threshold value. For example, it may be desirable to reduce the number of particles which are present in the initiating radiation source 1 so as to reduce any back-scattering of radiation which may occur, thereby reducing the glint in the initiating radiation source 1. A number of particles in the initiating radiation source 1 may be maintained below a threshold amount in order to prevent self-lasing from occurring in the initiating radiation source 1.

It will be appreciated from equation 1 that the propensity for self-lasing to occur in the initiating radiation source 1 increases with increasing gain in the amplification chambers (for constant glint $g_l$ and loss l). As was explained above, passing the pre-pulse laser beam 41 through the amplification chambers in the second order leads to a temporary reduction of the gain in the amplification chambers due to gain stripping. The reduction of the gain which is caused by the pre-pulse laser beam 41 therefore acts to decrease the likelihood of self-lasing occurring. In particular the reduction in gain which is caused by the pre-pulse laser beam 41 may allow the glint $g_l$ in the initiating radiation source 1 to increase without the condition which is given in equation 1 being satisfied such that self-lasing occurs. This may, for example, allow a greater number of particles to be present in the initiating radiation source without self-lasing occurring.

Additionally or alternatively the temporary reduction in the gain of the amplification chambers which is caused by the pre-pulse laser beam 41 may allow the initial gain (before gain stripping occurs) in the amplification chambers to be increased without self-lasing occurring in the initiating radiation source 1. This may be advantageous since an increase in the gain will allow the main-pulse laser beam 45 to be amplified to higher powers thereby increasing the amount of energy from the main-pulse laser beam 45 which may deposited into the fuel target 37. An increase in the initial gain in the amplification chambers will also result in an increase in the amplification of the pre-pulse laser beam in the amplification chambers. This may, for example, be compensated for by decreasing the power of the pre-pulse laser beam which is emitted from the seed module.

Whilst a specific embodiment of an initiating radiation source 1 has been described with reference to FIG. 5 an initiating radiation source according to other embodiments of the invention may be arranged differently than is shown in FIG. 5. In particular the arrangement of the amplification chambers PA0, PA1, PA2, PA3, the seed module 33 and the mirrors 43 which is shown in FIG. 5 is merely to aid understanding of the principles of the invention. In other embodiments the components of the initiating radiation source 1 may be arranged differently.

Figure 7:
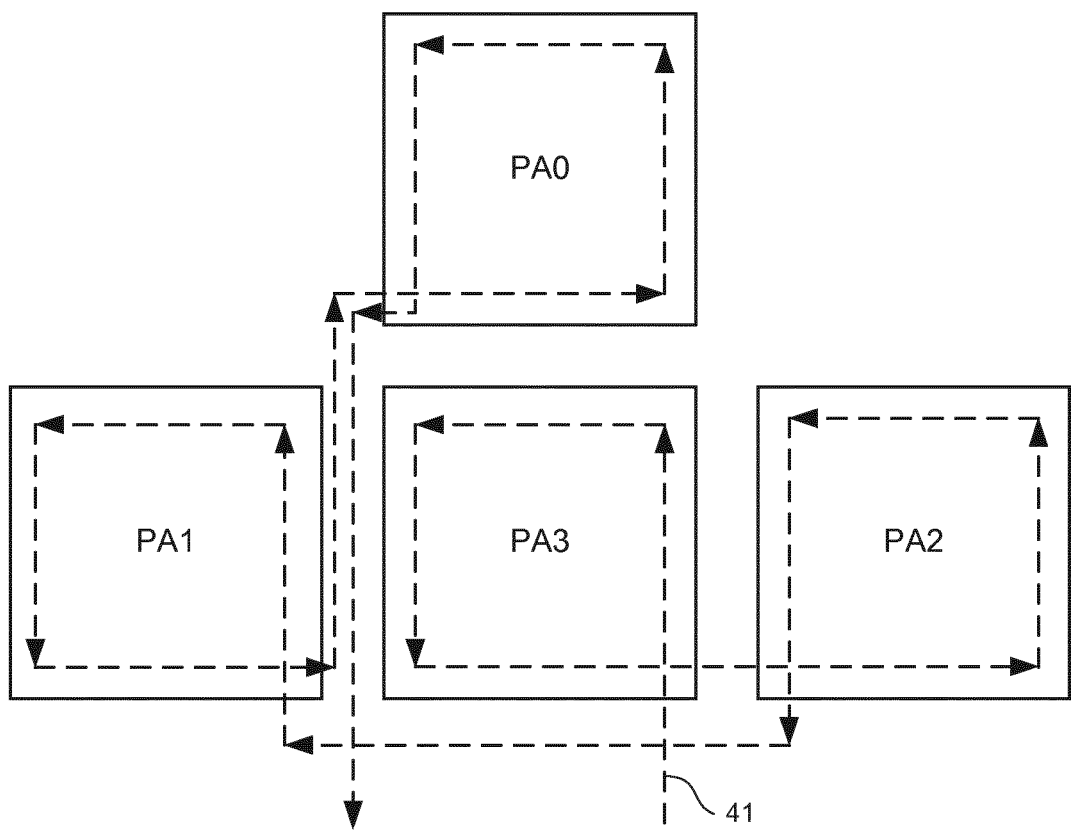
FIG. 7 is a schematic illustration of the path of a pre-pulse laser beam through amplification chambers of an initiating radiation source.

FIG. 7 is a schematic representation of an example arrangement of the amplification chambers PA0-PA3. Also shown in FIG. 7 is an example path on which a pre-pulse laser beam 41 may be directed through the amplification chambers. The pre-pulse laser beam 41 may be directed along its optical path by a series of mirrors (not shown in FIG. 7). The pre-pulse laser beam 41 is shown in FIG. 7 as propagating in a generally loop-like formation around each of the amplification chambers. In other embodiments the pre-pulse laser beam 41 may propagate around each amplification chamber more than once. For example, the pre-pulse laser beam 41 may propagate around a first loop in an amplification chamber on a first vertical level. The pre-pulse laser beam 41 may then be directed to a second vertical level within the amplification chamber on which the pre-pulse laser beam 41 may propagate around a second loop in the amplification chamber. Increasing the distance over which the pre-pulse laser beam 41 propagates in the amplification chambers may increase the amplification of the pre-pulse laser beam 41.

A main-pulse laser beam (not shown in FIG. 7) may follow a similar path to the pre-pulse laser beam 41 through the amplification chambers but may propagate in a reverse direction to the direction in which the pre-pulse laser beam 41 propagates. The path of a main-pulse laser beam and a pre-pulse laser beam may be joined with each other and/or separated from each other, for example, using mixing optics similar to the mixing optics 44 which were described above with reference to FIG. 5.

Embodiments have been described above in which a seed module 33 emits both the pre-pulse laser beam 41 and the main-pulse laser beam 45. The seed module may comprise a single laser or two or more lasers operable to emit a pre-pulse laser beam 41 and a main-pulse laser beam 45. For example, the seed module 33 may comprise a first laser operable to emit a pre-pulse laser beam 41 and a second laser operable to emit a main-pulse laser beam 45. The first and second laser may be housed together or may be separated from one another.

Whilst embodiments have been described above in which an initiating radiation source comprises four amplification chambers, in other embodiments an initiating radiation source may comprise other numbers of amplification chambers. In general, an initiating radiation source comprises a seed module and a plurality of amplification chambers each comprising a gain medium. The seed module is operable to emit a pre-pulse laser beam and a main-pulse laser beam.

The main-pulse laser beam is directed to pass through the amplification chambers and be amplified by the amplification chambers in a first order. The pre-pulse laser beam is directed to pass through the amplification chambers and be amplified by the amplification chambers in a second order which is the reverse of the first order.

The gains and saturation powers in the amplification chambers may be configured for amplification of the main-pulse laser beam passing through the amplification chambers in the first order. The amplification chambers may be configured such that the saturation powers of each the gain media in the amplification chambers decreases along the path of the pre-pulse laser beam through the amplification chambers in the second order. The amplification chambers may be configured such that the gains of each of the gain media in the amplification chambers increases along the path of the pre-pulse laser beam through the amplification chambers in the second order.

The gains and saturation powers in the amplification chambers may be determined by modelling the amplification of a pre-pulse and a main-pulse laser beam in the amplification chambers. For example, a computer model may be used which is based on the Frantz-Nodvik equation which is given by:

$$P_{out}(P_{sat}, G_0, P_{in}) = P_{sat} \ln\left[1 + e^{LG_0}\left(e^{\frac{P_{in}}{P_{sat}}} - 1\right)\right] \quad (2)$$

where $P_{out}$ is the power of a laser beam which is output from an amplification chamber, $P_{in}$ is the power of a laser beam which is input to an amplification chamber, $P_{sat}$ is the saturation power of the amplification chamber, $G_0$ is the small signal gain per unit length in the amplification chamber and L is the length of the optical path of the laser beam through the amplification chamber. The small signal gain $G_0$ is the gain which is experienced by a laser beam having a low enough power that no gain stripping occurs. A computer model based upon the Franz-Nodvik equation may be used to determine the gain and saturation power of each of a series of amplification chambers which results in an amplified pre-pulse laser beam and an amplified main-pulse laser beam having desired powers whilst ensuring that a reflected pre-pulse laser beam is not amplified to a power which may cause damage to the initiating radiation source.

In order to enable further understanding of the invention, details of several embodiments of initiating radiation sources according to the invention will now be given.

TABLE 1

Available powers in amplification chambers of an initiating radiation source according to an embodiment of the invention

|  | Available power for pre-pulse (kW) | Available power for main-pulse (kW) |
|---|---|---|
| PA0 | 1.3 | 2 |
| PA1 | 1.8 | 2.8 |
| PA2 | 6.7 | 10.4 |
| PA3 | 12.2 | 18.8 |

Table 1 gives available powers in amplification chambers of an initiating radiation source for a pre-pulse laser beam (having a wavelength of approximately 10.26 µm) and a main-pulse laser beam (having a wavelength of approximately 10.59 µm) operating at a repetition rate of approximately 50 kHz. The available power of an amplification chambers is the product of the small signal gain $G_0$, the saturation powers $P_{sat}$ and the length of amplification chamber.

TABLE 2

Powers and gain of a pre-pulse laser beam and a main-pulse laser beam during propagation through the amplification chambers specified in table 1.

|  | First Order | | Second Order | |
| --- | --- | --- | --- | --- |
| Pre-pulse seed power | 5 W | | 160 W | |
| Amplified pre-pulse power | 4 kW | | 4 kW | |
| Total gain available for the reflected pre-pulse | 1.65 m$^{-1}$ | | 0.62 m$^{-1}$ | |
| Reflectivity of fuel target | 0.1% | 0.5% | 0.1% | 0.5% |
| Reflected pre-pulse power | 4 W | 20 W | 4 W | 20 W |
| Amplified reflected pre-pulse power | 1070 W | 1998 W | 62 W | 302 W |
| Main-pulse seed power | 400 W | 400 W | 400 W | 400 W |
| Amplified main-pulse power | 24.7 kW | 23 kW | 23.2 kW | 22.9 kW |

Table 2 gives the powers and gains of a pre-pulse laser beam and a main-pulse laser beam as they propagate through the embodiment of the initiating radiation source which is given in table 1. The powers and gains are given for a pre-pulse laser beam (having an initial power of 5 W) which propagates through the amplification chambers in the first order and for a pre-pulse laser beam (having an initial power of 160 W) which propagates through the amplification chambers in the second order. The seed power of the pre-pulse and main-pulse laser beams which are specified in table 2 are the powers of the pre-pulse and main-pulse laser beams which are emitted from a seed module. The amplified powers of the pre-pulse and main-pulse laser beams which are specified in table 2 are the powers of the pre-pulse and main-pulse laser beams after they have propagated through the amplification chambers of the initiating radiation source. The total gain for the reflected pre-pulse which is specified in table 2 is the sum of the gains in the amplification chambers which remain for amplification of the reflected pre-pulse laser beam after the pre-pulse laser beam has passed through the amplification chambers. In each case values are given for two different fuel targets having a different reflectivity for the pre-pulse laser beam.

It can be seen from table 2 that the pre-pulse laser beam which propagates through the amplification chambers in the second order results in approximately 2.6 times less gain remaining in the amplification chambers for the amplification of the reflected pre-pulse laser beam when compared to the pre-pulse laser beam which propagates through the amplification chambers in the first order. Consequently the amplified reflected pre-pulse laser beam has a significantly smaller power.

It can further be seen from table 2 that the amplified main-pulse power is slightly decreased by passing the pre-pulse laser beam through the amplification chambers in the second order as opposed to the first order. However it will be appreciated that the decrease in the power of the main-pulse laser beam is only small and could, for example, be compensated for by slightly increasing the seed power of the main-pulse laser beam. In other embodiments passing the pre-pulse laser beam through the amplification chambers in the second order may lead to an increase in the power of the amplified main-pulse laser beam (when compared to passing the pre-pulse laser beam through the amplification chambers in the first order).

TABLE 3

Available powers in amplification chambers of an initiating radiation source according to an alternative embodiment of the invention

|  | Available power for pre-pulse (kW) | Available power for main-pulse (kW) |
| --- | --- | --- |
| PA0 | 2.3 | 3.6 |
| PA1 | 3.2 | 4.8 |
| PA2 | 6.7 | 10.4 |
| PA3 | 12.2 | 18.8 |

TABLE 4

Powers and gain of a pre-pulse laser beam and a main-pulse laser beam during propagation through the amplification chambers specified in table 3.

|  | First Order | | Second Order | |
| --- | --- | --- | --- | --- |
| Pre-pulse seed power | 2.6 W | | 45 W | |
| Amplified pre-pulse power | 4 kW | | 4 kW | |
| Total gain available for the reflected pre-pulse | 1.84 m$^{-1}$ | | 0.91 m$^{-1}$ | |
| Reflectivity of fuel target | 0.1% | 0.5% | 0.1% | 0.5% |
| Reflected pre-pulse power | 4 W | 20 W | 4 W | 20 W |
| Amplified reflected pre-pulse power | 1789 W | 3137 W | 176 W | 827 W |
| Main-pulse seed power | 400 W | 400 W | 400 W | 400 W |
| Amplified main-pulse power | 29.4 kW | 27.4 kW | 29.2 kW | 28.6 kW |

Table 3 gives the available powers of amplification chambers of an initiating radiation source according to a further embodiment of the invention. Table 4 gives the powers and gains of a pre-pulse laser beam and a main-pulse laser beam as they propagate through the embodiment of the initiating radiation source which is given in table 3.

The embodiment which is specified in table 3 has higher available powers in the amplification chambers PA0 and PA1 when compared to the embodiment which is specified in table 1. Consequently the pre-pulse laser beams which are specified in table 4 are emitted from the seed module with smaller initial powers but are amplified by the amplification chambers to the same powers as given in table 2. The higher available powers in the amplification chambers PA0 and PA1 also results in amplification of the main-pulse laser beam to a higher power thereby allowing more energy to be deposited into the fuel target.

It can be seen from table 4 that increasing the available powers in the amplification chambers PA0 and PA1, causes an increase in the power of the amplified reflected pre-pulse laser beams. However in the case of the pre-pulse laser beam which propagates through the amplification chambers in the second order the power of the amplified reflected pre-pulse laser beam may still be sufficiently low that no substantial damage is caused by the reflected pre-pulse laser beam. It may be desirable to ensure that the power of the amplified reflected pre-pulse laser beam remains below a given threshold. For example, it may be desirable for the power of the amplified reflected pre-pulse laser beam to be below approximately 1000 W. The power of the amplified reflected pre-pulse laser beam which is shown in table 4 may therefore be acceptable.

It will be appreciated from the embodiment which is given in tables 3 and 4 that passing the pre-pulse laser beam through the amplification chambers in the second order as opposed to in the first order may allow the available powers in the amplification chambers to be increased whilst keeping the power of the amplified reflected pre-pulse laser beam below a given threshold. This advantageously allows the power of the amplified main-pulse laser beam to be increased, thereby allowing for an increase in the energy which is deposited into a fuel target.

Whilst specific embodiments have been described above with reference to tables 1-4 it will be appreciated that additional factors not considered here may also affect the gain which is available in the amplification chambers for amplification of the pre-pulse and main-pulse laser beams and their respective reflected beams. For example, the amount of gain stripping which occurs in the amplification chambers depends on the duration of the pulses or the pre-pulse and main-pulse laser beams. A change in the duration of the pulses may therefore result in a change in the gain which is available to a reflected pre-pulse laser beam.

Whilst embodiments of the invention have been described in the context of an initiating radiation source which emits a pre-pulse laser beam and a main-pulse laser beam for excitation of a fuel target, the invention may be used in other applications. In general, a laser system is provided which comprises a seed module and a plurality of amplification chambers each comprising a gain medium. The seed module is operable to emit a pulse of a first laser beam and a pulse of a second laser beam. The first laser beam is directed to pass through the amplification chambers and be amplified by the amplification chambers in a second order. The second pulse laser beam is directed to pass through the amplification chambers and be amplified by the amplification chambers in a first order which is the reverse of the second order. Any reference above to an initiating radiation source may therefore be replaced with a reference to a laser system and any reference made to pre-pulse and main-pulse laser beams may be replaced with a reference to first and second laser beams respectively.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A laser system comprising:
   a seed module operable to emit a pulse of a first laser beam followed by a pulse of a second laser beam;
   a plurality of amplification chambers each comprising a gain medium having a gain; and
   an optical guiding system,
   wherein the optical guiding system is constructed and arranged to direct the pulse of the first laser beam through the plurality of amplification chambers in a second order to amplify the first laser beam, and
   wherein the optical guiding system is constructed and arranged to direct the pulse of the second laser beam through the plurality of amplification chambers in a first order which is the reverse of the second order to amplify the second laser beam.

2. The laser system of claim 1, wherein the gain media in the amplification chambers are configured such that propagation of the pulse of the first laser beam through the amplification chambers causes gain stripping in at least some of the amplification chambers.

3. The laser system of claim 1, wherein a saturation power of each of the gain media decreases along the path of the first laser beam through the amplification chambers in the second order.

4. The laser system of claim 1, wherein the gain of each of the gain media increases along a path of the first laser beam through the amplification chambers in the second order.

5. The laser system of claim 1, wherein the amplification chambers are configured such that the pulse of the first laser beam experiences a total amplification during its passage through the amplification chambers, which is less than the total amplification which is experienced by the pulse of the second laser beam during its passage through the amplification chambers.

6. The laser system of claim 1, wherein the seed module is configured to emit a pulse of the first laser beam having a first power and a pulse of the second laser beam having a second power, which is greater than the first power.

7. The laser system of claim 1, further comprising:
an optical isolator arranged in an optical path of the first laser beam and between the seed module and the amplification chambers,
wherein the optical isolator is configured to prevent a reflection of the first laser beam from entering the seed module,
wherein the seed module is configured to emit a polarized first laser beam having a first polarization state, and
wherein the optical isolator comprises a polarizer configured to transmit radiation having the first polarization state.

8. A radiation source comprising:
a fuel emitter configured to emit a fuel and to direct the fuel so as to provide a fuel target; and
an initiating radiation source comprising a laser system comprising:
a seed module operable to emit a pulse of a first laser beam followed by a pulse of a second laser beam;
a plurality of amplification chambers each comprising a gain medium having a gain; and
an optical guiding system,
wherein the optical guiding system is constructed and arranged to direct the pulse of the first laser beam through the plurality of amplification chambers in a second order to amplify the first laser beam, and
wherein the optical guiding system is constructed and arranged to direct the pulse of the second laser beam through the plurality of amplification chambers in a first order which is the reverse of the second order to amplify the second laser beam; and
a beam delivery system configured to direct the amplified first laser beam and the amplified second laser beam to be incident on the fuel target.

9. A lithographic system comprising:
a radiation source comprising:
a fuel emitter configured to emit a fuel and to direct the fuel so as to provide a fuel target; and
an initiating radiation source comprising a laser system comprising:
a seed module operable to emit a pulse of a first laser beam followed by a pulse of a second laser beam;
a plurality of amplification chambers each comprising a gain medium having a gain; and
an optical guiding system,
wherein the optical guiding system is constructed and arranged to direct the pulse of the first laser beam through the plurality of amplification chambers in a second order to amplify the first laser beam, and
wherein the optical guiding system is constructed and arranged to direct the pulse of the second laser beam through the plurality of amplification chambers in a first order which is the reverse of the second order to amplify the second laser beam; and
a beam delivery system configured to direct the amplified first laser beam and the amplified second laser beam to be incident on the fuel target; and
a lithographic apparatus arranged to receive a radiation beam from the radiation source, the lithographic apparatus comprising:
an illumination system configured to condition the radiation beam received from the radiation source;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto the substrate.

10. A method of providing first and second laser beams, the method comprising:
emitting a pulse of a first laser beam;
directing the pulse of the first laser beam through a plurality of amplification chambers in a second order, each comprising a gain medium;
emitting a pulse of a second laser beam; and
directing the pulse of the second laser beam through the plurality of amplification chambers in a first order, which is the reverse of the second order.

11. The method of claim 10, wherein the gain media in the amplification chambers are configured such that propagation of the pulse of the first laser beam through the amplification chambers causes gain stripping in at least some of the amplification chambers.

12. The method of claim 10, wherein a saturation power of each of the gain media decreases along a path of the first laser beam through the amplification chambers in the second order.

13. The method of claim 10, wherein the gain of each of the gain media increases along a path of the first laser beam through the amplification chambers in the second order.

14. The method of claim 10, wherein the pulse of the first laser beam experiences a total amplification during its passage through the amplification chambers, which is less than the total amplification that is experienced by the pulse of the second laser beam during its passage through the amplification chambers.

15. The method of claim 10, wherein the pulse of the first laser beam has a first wavelength and the pulse of the second laser beam has a second wavelength, which is different to the first wavelength.

* * * * *